(12) United States Patent
Arcudia et al.

(10) Patent No.: US 9,485,085 B2
(45) Date of Patent: Nov. 1, 2016

(54) PHASE LOCKED LOOP (PLL) ARCHITECTURE

(71) Applicant: QUALCOMM, Incorporated, San Diego, CA (US)

(72) Inventors: Kenneth Luis Arcudia, Cary, NC (US); Jeffrey Andrew Shafer, Raleigh, NC (US); Bupesh Pandita, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/644,029

(22) Filed: Mar. 10, 2015

(65) Prior Publication Data
US 2016/0269172 A1    Sep. 15, 2016

(51) Int. Cl.
*H04L 7/033*    (2006.01)
*H04L 7/04*     (2006.01)
(Continued)

(52) U.S. Cl.
CPC ........... *H04L 7/0332* (2013.01); *H03B 5/1212* (2013.01); *H03B 5/1228* (2013.01); *H04L 7/0025* (2013.01); *H04L 7/041* (2013.01)

(58) Field of Classification Search
CPC ... H04L 7/033; H04L 7/0332; H04L 7/0338; H03L 7/00; H03L 7/02; H03L 7/04; H03L 7/06; H03L 7/08; H03L 7/0802; H03L 7/0805; H03L 7/0807; H03L 7/081; H03L 7/0814; H03L 7/0816; H03L 7/0818; H03L 7/085; H03L 7/089; H03L 7/0891; H03L 7/0893; H03L 7/0895; H03L 7/091; H03L 7/093; H03L 7/097; H03L 7/099; H03L 7/0994; G05B 2219/34001

USPC .......................................................... 375/376
See application file for complete search history.

(56) References Cited

U.S. PATENT DOCUMENTS

| | | |
|---|---|---|
| 6,831,523 B1 | 12/2004 | Pastorello et al. |
| 7,212,076 B1 | 5/2007 | Taheri et |
| 7,420,427 B2 * | 9/2008 | Brown .................. H03L 7/0893 331/10 |

(Continued)

FOREIGN PATENT DOCUMENTS

JP    2005064663 A    3/2005

OTHER PUBLICATIONS

Ferriss M, et al., "An Integral Path Self-Calibration Scheme for a Dual-Loop PLL," IEEE Journal of Solid-State Circuits, vol. 48, No. 4, Apr. 2013, pp. 996-1008.

(Continued)

*Primary Examiner* — Siu Lee
(74) *Attorney, Agent, or Firm* — Loza & Loza LLP

(57) ABSTRACT

In one embodiment, a phase locked loop (PLL) comprises a voltage-controlled oscillator (VCO), a frequency divider configured to frequency divide an output signal of the VCO to produce a feedback signal, and a phase detection circuit configured to detect a phase difference between a reference signal and the feedback signal, and to generate an output signal based on the detected phase difference. The PLL also comprises a proportional circuit configured to generate a control voltage based on the output signal of the phase detection circuit, wherein the control voltage tunes a first capacitance of the VCO to provide phase correction. The PLL further comprises an integration circuit configured to convert the control voltage into a digital signal, to integrate the digital signal, and to tune a second capacitance of the VCO based on the integrated digital signal to provide frequency tracking.

28 Claims, 5 Drawing Sheets

(51) Int. Cl.
*H04L 7/00* (2006.01)
*H03B 5/12* (2006.01)

(56) References Cited

U.S. PATENT DOCUMENTS

| | | | |
|---|---|---|---|
| 7,508,898 | B2 | 3/2009 | Cyr et al. |
| 2005/0068113 | A1* | 3/2005 | Glenn .................. H03L 7/0891 331/16 |
| 2006/0009184 | A1 | 1/2006 | Goldman et al. |
| 2009/0085679 | A1 | 4/2009 | Jennings et al. |
| 2010/0271140 | A1* | 10/2010 | Raghunathan ............ H03L 7/22 331/34 |
| 2011/0012652 | A1 | 1/2011 | Lamanna et al. |
| 2011/0156829 | A1* | 6/2011 | Wang .................... H03L 7/0802 331/117 FE |
| 2012/0286586 | A1 | 11/2012 | Balm |
| 2013/0222067 | A1 | 8/2013 | Yin et al. |
| 2013/0257485 | A1 | 10/2013 | Nikaeen et al. |
| 2014/0070855 | A1 | 3/2014 | Ainspan et al. |

OTHER PUBLICATIONS

Sun Y, et al., "A Continuously Tunable Hybrid LC-VCO PLL With Mixed-Mode Dual-Path Control and Bi-level Modulated Coarse Tuning" IEEE, Transactions on Circuits and Systems—I (TCAS-I), vol. 58, No. 9, Sep. 2011, pp. 2149-2158.
International Search Report and Written Opinion—PCT/US2016/017847—ISA/EPE—May 11, 2016.

* cited by examiner

PHASE LOCKED LOOP (PLL) ARCHITECTURE

BACKGROUND

1. Field

Aspects of the present disclosure relate generally to frequency synthesis, and more particularly, to phase locked loops (PLLs).

2. Background

A phased locked loop (PLL) may be used in frequency synthesis to generate a signal having a desired frequency by multiplying the frequency of a reference signal by a corresponding amount. PLLs are widely used to provide signals having desired frequencies in wireless communication systems, micro-processing systems, and high-speed data systems.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a phase locked loop (PLL) is described herein. The PLL comprises a voltage-controlled oscillator (VCO), a frequency divider configured to frequency divide an output signal of the VCO to produce a feedback signal, and a phase detection circuit configured to detect a phase difference between a reference signal and the feedback signal, and to generate an output signal based on the detected phase difference. The PLL also comprises a proportional circuit configured to generate a control voltage based on the output signal of the phase detection circuit, wherein the control voltage tunes a first capacitance of the VCO to provide phase correction. The PLL further comprises an integration circuit configured to convert the control voltage into a digital signal, to integrate the digital signal, and to tune a second capacitance of the VCO based on the integrated digital signal to provide frequency tracking.

A second aspect relates to a method of operating a phase locked loop (PLL). The method comprises dividing a frequency of an output signal of a voltage-controlled oscillator (VCO) to produce a feedback signal, detecting a phase difference between a reference signal and the feedback signal, generating a control voltage based on the detected phase difference, and tuning a first capacitance of the VCO using the control voltage to provide phase correction. The method also comprises converting the control voltage into a digital signal, integrating the digital signal, and tuning a second capacitance of the VCO based on the integrated digital signal to provide frequency tracking.

A third aspect relates to an apparatus. The apparatus comprises means for dividing a frequency of an output signal of a voltage-controlled oscillator (VCO) to produce a feedback signal, means for detecting a phase difference between a reference signal and the feedback signal, means for generating a control voltage based on the detected phase difference, and means for tuning a first capacitance of the VCO using the control voltage to provide phase correction. The apparatus also comprises means for converting the control voltage into a digital signal, means for integrating the digital signal, and means for tuning a second capacitance of the VCO based on the integrated digital signal to provide frequency tracking.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
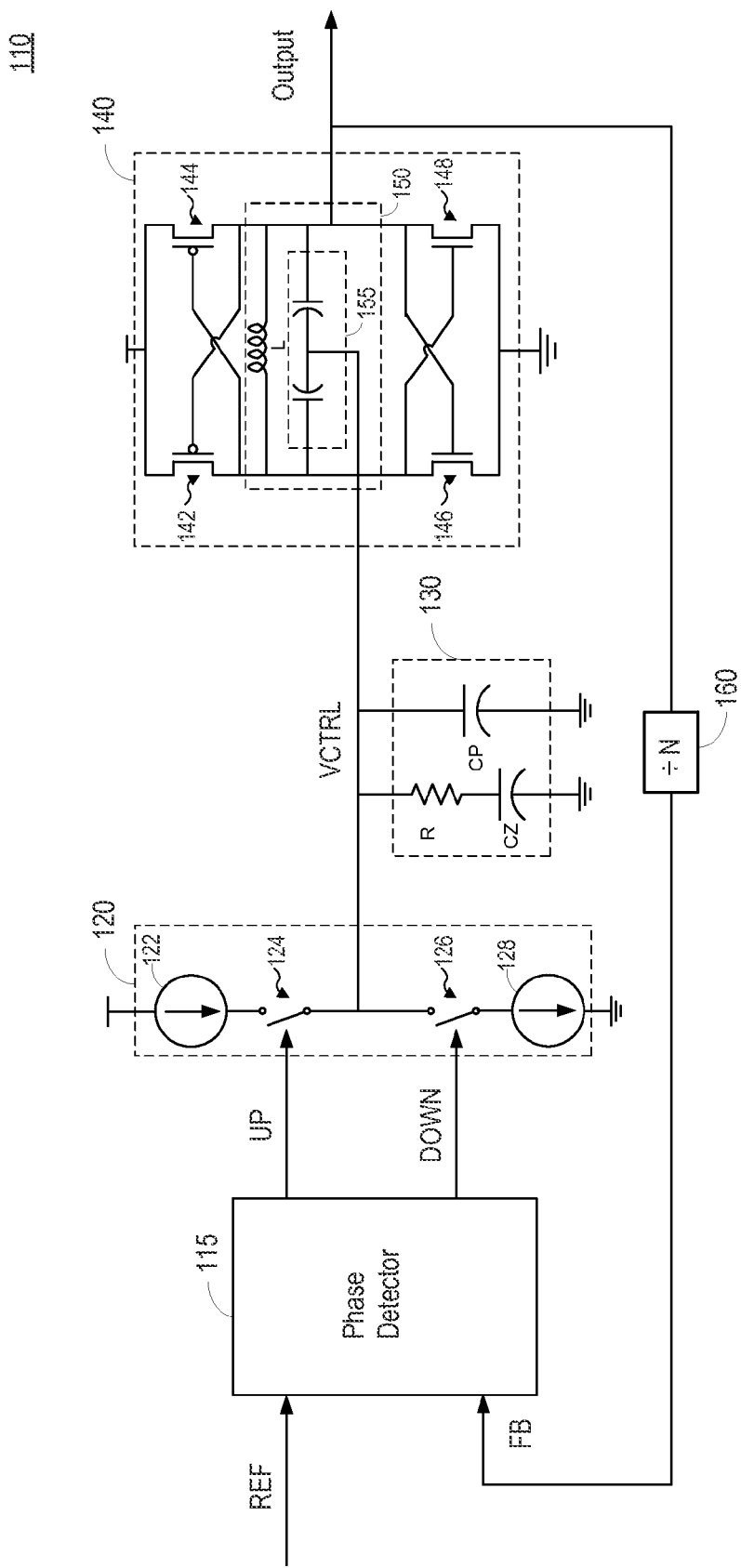
FIG. 1 shows an example of a phased locked loop (PLL).

FIG. 1 shows an example of an analog PLL 110. The PLL 110 comprises a phase detector 115, a charge pump 120, a loop filter 130, a voltage-controlled oscillator (VCO) 140, and a feedback frequency divider 160. The output of the VCO 140 provides the output signal for the PLL 110, in which the frequency of the output signal is controlled by adjusting an input voltage to the VCO 140, as discussed further below. The output signal is fed back to the phase detector 115 through the frequency divider 160. The frequency divider 160 divides the frequency of the output signal by N to produce a feedback signal (denoted "FB") having a frequency equal to $f_{out}/N$, where $f_{out}$ is the frequency of the output signal.

The phase detector 115 receives as inputs the feedback signal FB and a reference signal (denoted "REF"). The reference signal may come from a crystal oscillator or another source. The phase detector 115 detects the phase difference between the reference signal REF and the feedback signal FB, and outputs the detected phase difference to the charge pump 120. The charge pump 120 and the loop filter 130 convert the detected phase difference into a control voltage (denoted "VCTRL") that controls the frequency of the VCO 140. The control voltage VCTRL adjusts the frequency of the VCO 130 in a direction that reduces the phase difference between the reference signal REF and the feedback signal FB. When the PLL 110 is locked, the output signal has a frequency approximately equal to N times the frequency of the reference signal. Thus, the PLL 110 multiplies the frequency of the reference signal by N.

In this example, when the PLL 110 is locked, the phase detector 115 outputs an UP signal or a DOWN signal during each cycle of the reference signal based on the phase difference between the reference signal REF and the feedback signal FB. More particularly, the phase detector 115 outputs an UP signal when the phase of the reference signal leads the phase of the feedback signal, in which the width of the UP signal is proportional to the phase difference. The phase detector 115 outputs a DOWN signal when the phase of the reference signal lags the phase of the feedback signal, in which the width of the DOWN signal is proportional to the phase difference.

In this example, the charge pump 120 comprises a first current source 122, a first switch 124, a second current source 128, and a second switch 126. The switches 124 and 126 are controlled by the UP and DOWN signals, respectively, from the phase detector 115. More particularly, the first switch 124 closes when the phase detector 115 outputs an UP signal. This allows current from the first current source 122 to flow to the loop filter 130 through the first switch 124 for the duration of the UP signal (which is proportional to the phase difference between the reference signal and the feedback signal). The second switch 126 closes when the phase detector 115 outputs a DOWN signal. This causes the second current source 128 to draw current from the loop filter 130 through the second switch 128 for the duration of the DOWN signal (which is proportional to the phase difference between the reference signal and the feedback signal). Thus, the charge pump 120 outputs current to the loop filter 130 when the phase of the reference signal REF leads the phase of the feedback signal FB, and draws current from the loop filter 130 when the phase of the reference signal REF lags the phase of the feedback signal FB.

The loop filter 130 is used to stabilize the PLL 110 and reduce jitter. The loop filter 130 may be implemented using a resistor-capacitor (RC) filter, as shown in FIG. 1. In this example, the loop filter 130 comprises a resistor R, a first capacitor CZ, and a second capacitor CP. The resistor R produces a component of the control voltage VCTRL that is approximately proportional to the detected phase difference to provide phase correction. The first capacitor CZ integrates the phase difference to provide frequency tracking. The second capacitor CP is used to smooth out ripple noise on the control voltage VCTRL (e.g., caused by switching of the charge pump) to reduce jitter. Typically, the capacitance of the first capacitor CZ is much larger than the capacitance of the second capacitor CP for stability.

In the example in FIG. 1, the VCO 140 comprises an inductor-capacitor (LC) tank 150, a pair of cross-coupled PMOS transistors 142 and 144, and a pair of cross-coupled NMOS transistors 146 and 148. The LC tank 150 comprises an inductor L and varactors 155 coupled to the control voltage VCTRL from the loop filter 130. The varactors 155 are voltage-controlled capacitors having a capacitance that is controlled by the control voltage VCTRL, and may be implemented with metal-oxide-semiconductor (MOS) varactors. The resonant frequency of the LC tank 150 is a function of the capacitance of the varactors 155 and the inductance of the inductor L. Since the capacitance of the varactors 155 is controlled by the control voltage VCTRL, the frequency of the LC tank 150 (and hence the frequency of the VCO 140) is controlled by the control voltage VCTRL. The cross-coupled PMOS transistors 142 and 144 and cross-coupled NMOS transistors 146 and 148 provide a negative resistance that compensates for parasitic resistance in the LC tank 150.

The PLL 110 in FIG. 1 has several drawbacks. To begin, a large varactor gain is required to cover a wide tuning range. However, this lowers the Q factor of the varactors, and, as a consequence, degrades the VCO phase noise. In addition, varactor non-linearity adversely affects both proportional and integral gains of the PLL, and hence the loop dynamics of the PLL. In addition, the integrating capacitor CZ can be relatively large, especially for applications requiring a low bandwidth loop. As a result, the capacitor CZ may require a large silicon area, making it difficult to integrate the capacitor CZ on a chip.

Figure 2:
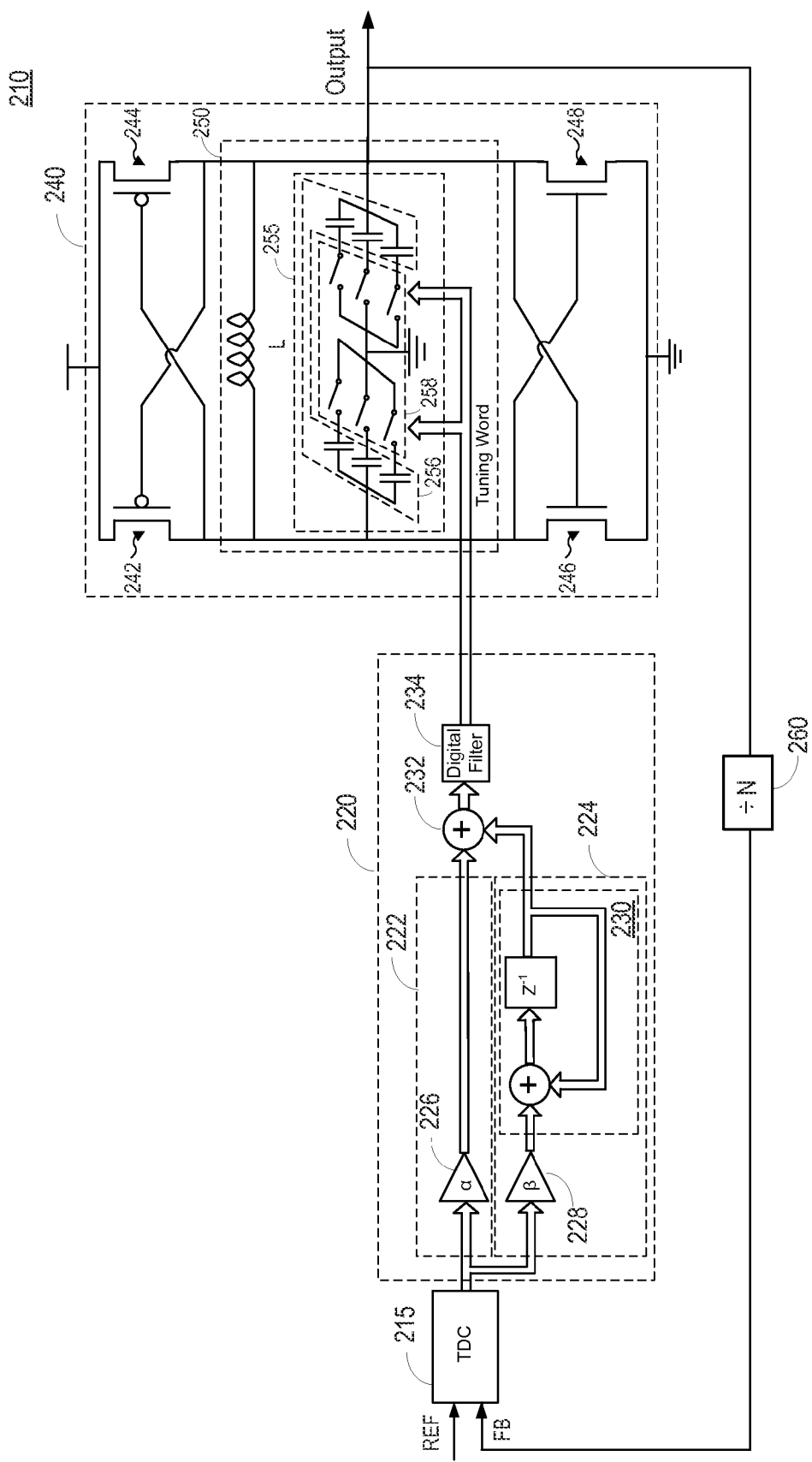
FIG. 2 shows an example of a digital PLL.

FIG. 2 shows an example of a digital PLL 210. The digital PLL 210 avoids drawbacks of the PLL 110 discussed above (e.g., large integrating capacitor CZ and narrow tuning range of the varactors). However, the digital PLL 210 in FIG. 2 has other drawbacks, as discussed further below.

The digital PLL 210 comprises a time-to-digital converter (TDC) 215, a digital loop filter 220, a VCO 240, and a feedback frequency divider 260. In operation, the output signal from the VCO 240 is fed back to the TDC 215 through the frequency divider 260. The frequency divider 260 divides the frequency of the output signal by N to produce a feedback signal (denoted "FB") having a frequency equal to $f_{out}/N$, where $f_{out}$ is the frequency of the output signal.

The TDC 215 receives as inputs the feedback signal FB and a reference signal (denoted "REF"). The TDC 215 detects the phase difference between the reference signal REF and the feedback FB, and outputs the detected phase difference as a digital signal. For example, the TDC 215 may detect the phase difference by measuring a time difference between edges of the reference signal REF and the feedback FB, and outputting the measured time difference as a digital signal. The digital loop filter 220 filters the digital signal from the TDC 215 in the digital domain. The resulting filtered digital signal controls the frequency of the VCO 240, as discussed further below.

In the example in FIG. 2, the digital loop filter 220 comprises a proportional path 222, an integration path 224, a summer 232, and a digital filter 234. The proportional path 222 comprises a first digital multiplier 226 that multiples the digital output of the TDC 215 by coefficient α. The integration path 224 comprises a second digital multiplier 228 and a digital integrator 230. The digital integrator 230 may be implemented with a digital accumulator, as shown in FIG. 2. The second multiplier 228 multiples the digital output of the TDC 215 by coefficient β and the digital integrator 230 integrates the resulting signal. The summer 232 sums the outputs of the proportional path 222 and the integration path 224. The digital filter 234 converts the signal from the summer 232 into a tuning word that adjusts the frequency of the VCO 240, as discussed further below.

In the example in FIG. 2, the VCO 240 comprises an inductor-capacitor (LC) tank 250, a pair of cross-coupled PMOS transistors 242 and 244, and a pair of cross-coupled NMOS transistors 246 and 248. The LC tank 250 comprises an inductor L and a capacitor bank 255 that receives the tuning word from the digital loop filter 220. The capacitor bank 255 comprises a plurality of capacitors 256 and a plurality of switches 258, in which each switch is configured to selectively couple a respective one of the capacitors to the inductor L. The tuning word comprises parallel bits, where each of the bits controls whether a respective one of the switches is turned on or off. When a switch is turned on by the respective bit, the capacitance of respective capacitor contributes to the total capacitance of the capacitor bank 255, and, when a switch is turned off by the respective bit, the capacitance of the respective capacitor does not contribute to the total capacitance of the capacitor bank 255. Thus, the tuning word controls the capacitance of the capacitor bank 255 by controlling the number of the capacitors 256 that are switched on. Since the capacitance of the capacitor bank 255 controls the frequency of the LC tank 250, the tuning word controls the frequency of the LC tank 250 (and hence frequency of the VCO 240) by controlling the capacitance of the capacitor bank 255. The cross-coupled PMOS transistors 242 and 244 and cross-coupled NMOS transistors 246 and 248 provide a negative resistance that compensates for parasitic resistance in the LC tank 250.

The digital PLL 210 in FIG. 2 has several drawbacks. To begin, the quantization of phase steps in the digital PLL causes spurs. In order to achieve desired phase noise, the TDC 215 needs to have very high time resolution (e.g., pico-second order accuracy), which may be difficult to implement. Further, in the case where the TDC 215 is implemented using a chain of delay elements, excessive variation of the delay elements in the TDC 215 can negatively impact system accuracy. Lastly, the digital PLL 210 may not be practical for SerDes standards that require high-bandwidth PLLs.

Figure 3:
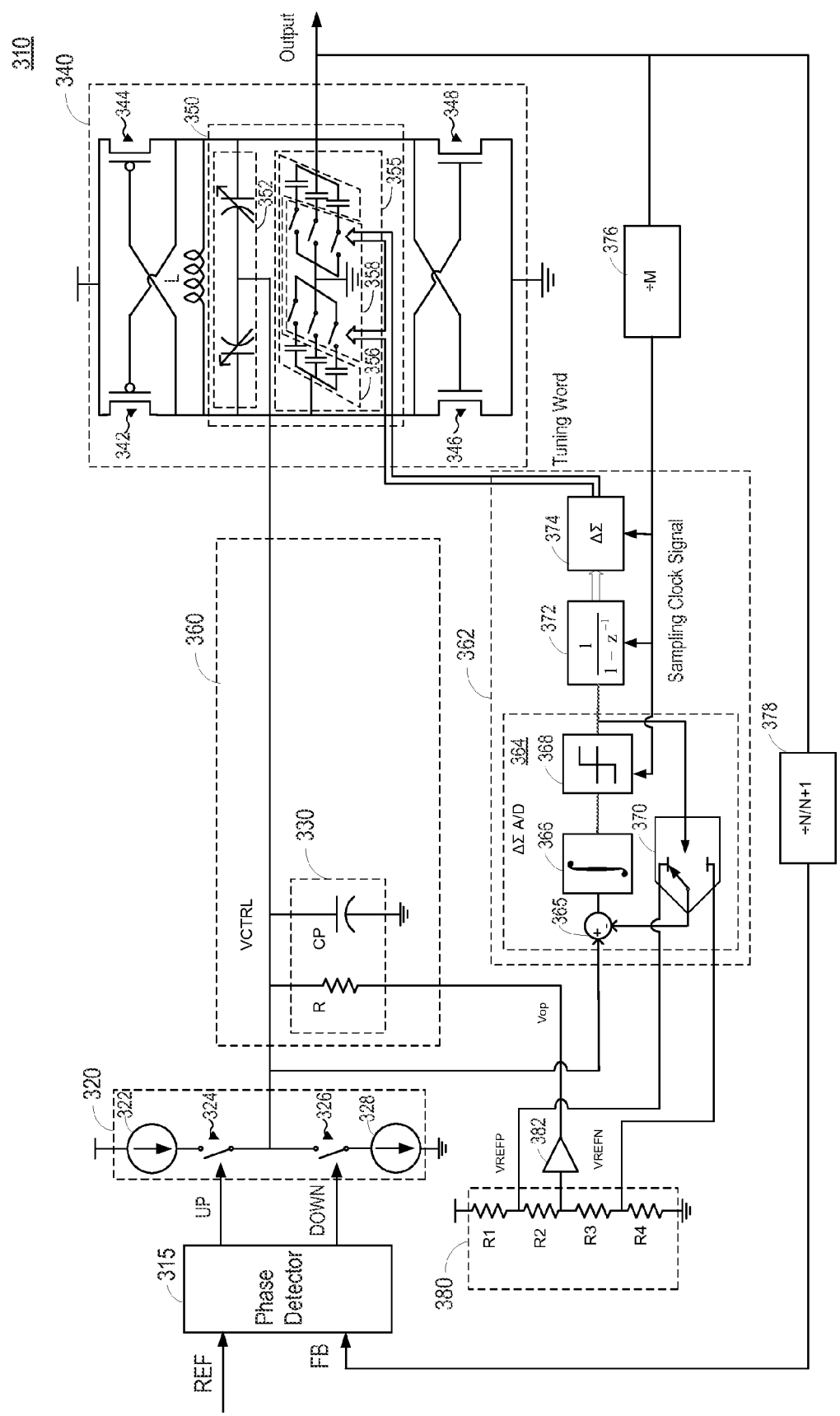
FIG. 3 shows a PLL according to an embodiment of the present disclosure.

FIG. 3 shows a PLL 310 according to an embodiment of the present disclosure. The PLL 310 is a hybrid PLL that provides both analog and digital loop filtering, as discussed further below. The PLL 310 comprises a phase detector 315, a charge pump 320, a proportional circuit 360, an integration circuit 362, a VCO 340, and a feedback frequency divider 378.

The proportional circuit 360 comprises an analog loop filter 330 (e.g., RC loop filter). In the example in FIG. 3, the analog loop filter 330 comprises a resistor R and a capacitor CP. The resistor R provides phase correction for the PLL, and the capacitor CP reduces ripple noise to reduce jitter. In this example, the analog loop filter 330 does not include a large integrating capacitor (e.g., capacitor CZ in FIG. 1), thereby significantly reducing the area of the analog loop filter 330. This is because the integrating function for the PLL is performed by the integration circuit 362, as discussed further below.

The integration circuit 362 comprises an analog-to-digital converter (ADC) 364, a digital integrator 372, and a sigma-delta modulator 374. The integration circuit 362 performs integration for frequency tracking, as discussed further below.

The VCO 340 comprises an LC tank 350 including an inductor L, varactors 352 and a capacitor bank 355. The capacitor bank 355 comprises a plurality of capacitors 356 and a plurality of switches 358, in which each switch is configured to selectively couple a respective one of the capacitors to the inductor L in the LC tank. The capacitors 356 may be implemented with metal capacitors. The capacitance of the varactors 352 is controlled (tuned) by the proportional circuit 360 and the capacitance of the capacitor bank 355 is controlled (tuned) by the integration circuit 362, as discussed further below.

In operation, the output signal from the VCO 340 is fed back to the phase detector 315 through the frequency divider 378. In the example shown in FIG. 3, the frequency divider 378 is a fractional N frequency divider that divides the frequency of the output signal by a fractional number between N and N+1 to produce a feedback signal (denoted "FB"), where N is an integer. This is accomplished by toggling the frequency divider 378 between N and N+1, in which the percentage of the time spent on N and the percentage of the time spent on N+1 can be adjusted to select a desired fractional number between N and N+1 with fine granularity.

The phase detector 315 receives as inputs the feedback signal FB and a reference signal (denoted "REF"). The phase detector 315 detects the phase difference between the reference signal REF and the feedback signal FB, and outputs the detected phase difference to the charge pump 320. The charge pump 320 and the analog loop filter 330 convert the detected phase difference into a control voltage VCTRL, which is coupled to the varactors 352 in the VCO 340 to tune the capacitance of the varactors 352. In the example in FIG. 3, the resistor R in the analog loop filter 330 produces a component of the control voltage that is approximately proportional to the detected phase difference to provide phase correction for the PLL. The phase correction may only require a relatively small tuning range for the varactors 352. This allows the varactors to stay within a linear region of the varactors, as discussed further below.

The ADC 364 in the integration circuit 362 converts the control voltage VCTRL into a digital signal. The digital integrator 372 integrates the digital signal, and the sigma-delta modulator 374 converts the integrated digital signal into a digital tuning word that controls the capacitance of the capacitor bank 355 in the VCO 340. In this regard, the tuning word comprises a plurality of parallel bits, where each bit controls whether a respective one of the switches in the capacitor bank 355 is turned on or off, and hence controls whether the capacitance of the respective capacitor contributes to the total capacitance of the capacitor bank 355. Thus, the integration circuit 362 integrates the detected phase difference, and tunes the capacitance of the capacitor bank 355 based on the integration. The integration adjusts the output frequency of the VCO 340 to provide frequency tracking for the PLL. The capacitor bank 355 may have a wider tuning range than the varactors 352 since frequency tracking may require a wider tuning range than phase correction.

Thus, the PLL 310 has a dual tuning architecture in which the proportional circuit 360 tunes the capacitance of varactors 352 in the VCO 340 to provide phase correction and the integration circuit 362 tunes the capacitance of the capacitance bank 355 in the VCO 340 to provide frequency tracking.

The PLL 310 mitigates drawbacks of the PLL 110 in FIG. 1. First, the varactors 352 may be operated over a relatively small linear region to reduce the impact of varactor non-linearity on the performance of the PLL. This is because the proportional circuit 360 (which controls the varactors 352) may only need to tune the varactors 352 over a relatively small range to provide phase correction. The varactors 352 do not need a wide tuning range for frequency tracking, which is provided by the capacitor bank 355. Second, the analog loop filter 330 does not require a large integrating capacitor, thereby significantly reducing the size of the analog loop filter 330 compared to the loop filter 130 in FIG. 1. This is because integration is performed in the integration circuit 362.

The PLL 310 also mitigates drawbacks of the digital PLL 210 in FIG. 2. To begin, the PLL 310 does not use a TDC, and therefore avoids the problems associated with TDCs discussed above. This is because the ADC 364 converts a voltage (e.g., control voltage VCTRL) into a digital signal instead of converting a time difference between edges of the reference signal REF and feedback signal FB into a digital signal, which may be difficult to implement with high enough time resolution to achieve sufficiently low phase quantization noise.

In the example in FIG. 3, the resistor R in the analog loop filter 330 is coupled between the varactors 352 and an operating-point voltage (denoted "Vop"). The operating-point voltage Vop is used to center the control voltage VCTRL at or close to an optimal operating point of the varactors 352, where the optimal operating point may be within a linear region of the varactors 352. During operation, the control voltage VCTRL varies over a small range about the operating-point voltage Vop to provide phase correction. As a result, the control voltage VCTRL may stay within a linear region of the varactors 352, thereby reducing the impact of varactor non-linearity on PLL performance.

The operating-point voltage Vop may be provided by a voltage divider 380 and an amplifier 382 with a low output impedance, as shown in the example in FIG. 3. The voltage divider 380 comprises resistors R1, R2, R2 and R4 coupled in series between a supply voltage Vdd and ground. The input of the amplifier 382 is coupled to a node between resistors R2 and R3 of the voltage divider 380, and the low-impedance output of the amplifier 382 is coupled to the resistor R. In this example, the operating-point voltage Vop is set to a value approximately equal to:

$$Vop=((R3+R4)/(R1+R2+R3+R4))\cdot Vdd \qquad (1)$$

where R1, R2, R3 and R4 in equation (1) are the resistance values of resistors R1, R2, R3 and R4, respectively. The resistance values of resistors R1, R2, R3 and R4 may be chosen such that the operating-point voltage Vop centers the control voltage VCTRL at or close to the optimal operating point of the varactors 352. Collectively, the voltage divider 380 and low-output-impedance amplifier 382 may be considered a voltage generation circuit.

In the example in FIG. 3, the ADC 364 is implemented with a sigma-delta ADC configured to digitize the control voltage VCTRL into a bit stream. The sigma-delta ADC is able to achieve high resolution by sampling the control voltage VCTRL at a high sampling rate, as discussed further below. The sigma-delta ADC comprises a subtractor 365, an integrator 366, a comparator 368, and a 1-bit feedback digital-to-analog converter (DAC) 370.

The bit stream output of the sigma-delta ADC is provided at the output of the comparator 368. The output is fed back to the 1-bit feedback DAC 370 which converts each bit of the output into one of two voltages depending on the value of the bit. In the example in FIG. 3, the two voltages comprise a first reference voltage (denoted "VREFP") and a second reference voltage (denoted "VREFN"), where the first reference voltage VREFP is higher than the second reference voltage VREFN. In this example, the 1-bit DAC 370 may output the first reference voltage VREFP when a bit has a value of one, and output the second reference voltage VREFN when a bit has a value of zero. The values of the first and second reference voltages VREFP and VREFN may be chosen such that the control voltage VCTRL varies within a voltage range between the first and second reference voltages VREFP and VREFN.

The subtractor 365 receives as inputs the control voltage VCTRL and the output voltage of the 1-bit DAC 370, and outputs the difference between the control voltage VCTRL and the output voltage of the 1-bit DAC 370 (which is VREFP or VREFN). The subtractor 365 may be implemented with a difference amplifier or another type of circuit.

The integrator 366 integrates the difference from the subtractor 365, and may be implemented with an integrating capacitor.

The comparator 368 compares the output of the integrator 366 to a reference voltage, and outputs a bit based on the comparison. For example, the comparator 368 may output a bit having a value of one if the output of the integrator 366 is above the reference voltage and output a bit having a value of zero if the output of the integrator 366 is below the reference voltage. In one aspect, the comparator 368 may receive a sampling clock signal. In this aspect, the comparator 368 may perform a comparison and output a bit based on the comparison during each cycle (period) of the sampling clock signal. As a result, the comparator 368 outputs a bit stream at a sampling rate set by the frequency of the sampling clock signal. The sampling rate may be set high to provide high resolution for the sigma-delta ADC, as discussed above. In this example, the comparator 368 may be implemented with a comparing amplifier and a latch clocked by the sampling clock signal.

In the example in FIG. 3, the PLL 310 includes a second frequency divider 376 that divides the frequency of the PLL output by M to produce the sampling clock signal provided to the sigma-delta ADC. The value of M may be smaller than the value of N so that the sigma-delta ADC samples the control voltage VCRTL at a sampling rate that is higher than the frequency of the reference signal and feedback signal. The value of M may be adjusted to achieve a desired sampling rate for the sigma-delta ADC.

In the example in FIG. 3, the first reference voltage VREFP and the second reference voltage VREFN used by the 1-bit feedback DAC 370 are provided by the voltage divider 380. More particularly, the first reference voltage VREFP is provided at a node between resistors R1 and R2 of the voltage divider 380, and the second reference voltage VREFN is provided at a node between resistors R3 and R4 of the voltage divider 380. As result, the value of the first reference voltage VREFP is given by:

$$VREFP=((R2+R3+R4)/(R1+R2+R3+R4))\cdot Vdd \qquad (2)$$

where R1, R2, R3 and R4 in equation (2) are the resistance values of resistors R1, R2, R3 and R4, respectively, and Vdd is the supply voltage. The value of the second reference voltage VREFN is given by:

$$VREFN=((R4)/(R1+R2+R3+R4))\cdot Vdd \qquad (3)$$

where R1, R2, R3 and R4 in equation (3) are the resistance values of resistors R1, R2, R3 and R4, respectively, and Vdd is the supply voltage. As shown in equations (1)-(3), the operating-point voltage Vop is between the first reference voltage VREFP and the second reference voltage VREFN. In this example, the resistance values of resistors R1, R2, R3 and R4 may be chosen such that the control voltage VCTRL (which varies about Vop over a small range) stays within a voltage range between the first reference voltage VREFP and the second reference voltage VREFN.

As discussed above, the digital integrator 372 integrates the output of the ADC 364. The integrator 372 may be implemented with a digital accumulator that is clocked by the sampling clock signal, as shown in FIG. 3. The output of the integrator 372 may be in the form of an n-bit digital word, which may be output to the sigma-delta modulator 374.

The sigma-delta modulator 374 modulates the output of the integrator 372 to provide fine capacitance tuning More particularly, the sigma-delta modulator 374 modulates the output of the integrator 372 into a tuning word comprising parallel bits, where each bit controls whether a respective one of the switches in the capacitor bank 355 is turned on or off, and hence controls whether the capacitance of the respective capacitor contributes to the total capacitance of the capacitor bank 355. In one aspect, the sigma-delta modulator 374 provides fine capacitance tuning by having the tuning word toggle the capacitor bank 355 between two or more capacitance values at a high rate, where each capacitance value is realized by switching on a different number of capacitors in the capacitor bank 355. This results in an effective capacitance for the capacitor bank 355 that is a function of the percentage of time the capacitor bank spends on each of the capacitance values (i.e., the effective capacitance is obtained by an interpolation of the capacitance values). For example, if each capacitor in the capacitor bank has a capacitance of $c_{unit}$, the sigma-delta modulator 374 can tune the effective capacitance of the capacitor bank to a value of 100.5 times $c_{unit}$ by having the tuning word alternating switch on 100 capacitors and 101 capacitors in the capacitor bank 355 at a high rate. In the example in FIG. 3, the sigma-delta modulator 374 receives the sampling clock signal and updates the tuning word at a high rate set by the sampling clock signal. Thus, the sigma-delta modulator 374 can tune the effective capacitance of the capacitor bank 355 in steps that are smaller than the capacitance of an individual capacitor in the capacitor bank 355.

In the example in FIG. 3, the phase detector 315 and the charge pump 320 are similar to the phase detector 115 and the charge pump 120 in FIG. 1. When the PLL 310 is locked, the phase detector 315 outputs an UP signal or DOWN signal during each cycle of the reference signal depending on whether the phase of the reference signal leads or lags the phase of the feedback signal, as discussed above. The charge pump 320 comprises a first current source 322, a first switch 324, a second current source 328, and a second switch 326. The switches 324 and 326 are controlled by the UP and DOWN signals, respectively, from the phase detector 315. More particularly, the first switch 324 closes when the phase detector 315 outputs an UP signal, allowing current from the first current source 322 to flow to the loop filter 330 through the first switch 324 for the duration of the UP signal. The second switch 326 closes when the phase detector 315 outputs a DOWN signal, causing the second current source 328 to draw current from the loop filter 130 through the second switch 328 for the duration of the DOWN signal. The phase detector 315 and the charge pump 320 may collectively be considered a phase detection circuit that outputs a signal to the loop filter 330 based on the detected phase difference between the reference signal REF and the feedback signal FB.

Figure 4:
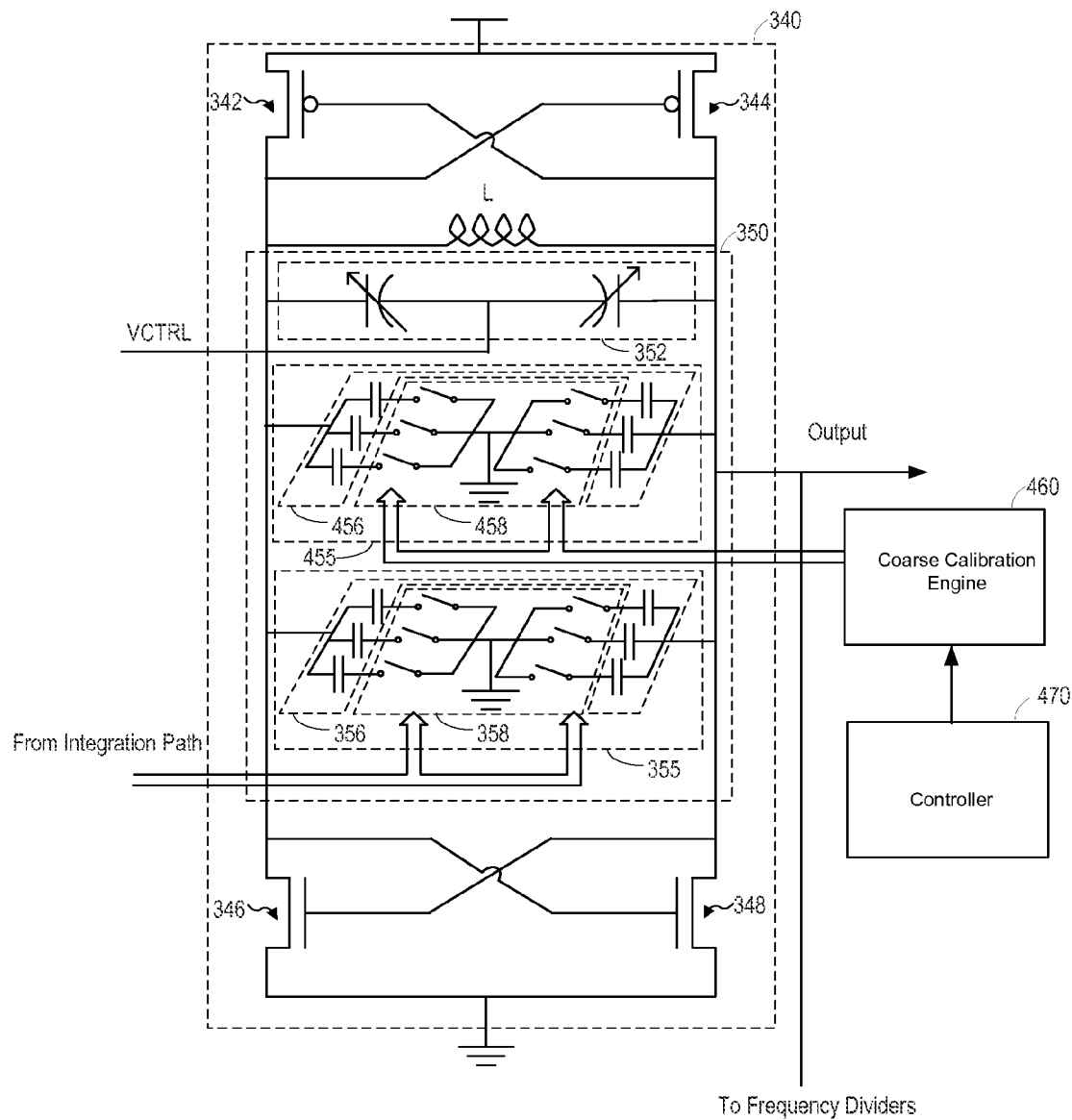
FIG. 4 shows a voltage-controlled oscillator (VCO) according to an embodiment of the present disclosure.

FIG. 4 shows an embodiment of the VCO 340 in which the LC tank 350 of the VCO 340 includes a second capacitor bank 455. The capacitance of the second capacitor bank 455 is tuned by a coarse calibration engine 460 to provide coarse frequency tuning of the VCO 340, as discussed further below. In the following discussion, the capacitor bank 355 tuned by the integration circuit 362 will be referred to as the first capacitor bank 355 for ease of discussion.

The second capacitor bank 455 comprises a plurality of capacitors 456 and a plurality of switches 458, in which each switch is configured to selectively couple a respective one of the capacitors to the inductor L. The coarse calibration engine 460 may control the capacitance of the second capacitor bank 455 by individually controlling the switches 458 in the second capacitor bank 455. For example, the coarse calibration engine 460 may output a coarse tuning word comprising parallel bits, where each of the bits controls whether a respective one of the switches is turned on or off. When a switch is turned on by the respective bit, the capacitance of respective capacitor contributes to the total capacitance of the second capacitor bank 455, and, when a switch is turned off by the respective bit, the capacitance of the respective capacitor does not contribute to the total capacitance of the second capacitor bank 455. In this example, the coarse calibration engine 460 may set each bit of the coarse tuning word to achieve a desired capacitance for the second capacitor bank 455.

Before the PLL 310 performs phase locking, the coarse calibration engine 460 may tune the capacitance of the second capacitor bank 455 to a value corresponding to a desired output frequency for the PLL 310. For example, the coarse calibration engine 460 may tune the capacitance of the second capacitor bank 455 so that the initial frequency of the VCO 340 is close to the desired output frequency. This reduces the tuning range required by the first capacitor bank 355 during operation of the PLL 310 for frequency tracking. Thus, the coarse calibration engine 460 may perform initial frequency tuning of the VCO 340, and the integration circuit may perform frequency tuning during operation of the PLL 310 for frequency tracking. During phase locking, the capacitance of the second capacitor bank 455 may be held constant at the value set by the coarse calibration engine 460 during initial frequency tuning.

In some applications, it may be desirable to change the output frequency of the PLL 310. For example, the output of the PLL 310 may be used to provide a clock signal to a data communication system (e.g., SerDes) that supports different data rates corresponding to different clock frequencies. In this example, the coarse calibration engine 460 may be configured to tune the capacitance of the second capacitor bank 455 to different values corresponding to the different data rates supported by the data communication system. A controller 470 may select the data rate of the data communication system, and instruct the coarse calibration engine 460 to tune the capacitance of the second capacitor bank 455 according to the selected data rate. In response, the coarse calibration engine 460 may tune the capacitance of the second capacitor bank 455 so that the initial frequency of the VCO 340 is close to the frequency corresponding to the selected data rate. This reduces the tuning range required by the first capacitor bank 355 for frequency tracking. The controller 470 may also adjust the divisor of the feedback frequency divider 378 so that the PLL 310 outputs a frequency corresponding to the selected data rate when the PLL 310 is locked. In this example, the controller 470 may select the data rate for the data communication system based on channel conditions, type of data being transmitted/received, etc. For instance, the controller 470 may select a higher data rate for good channel conditions and a lower data rate for bad channel conditions. Further, the controller 470 may use a higher data rate for high bandwidth data (e.g., high-definition video) and a lower data rate for low bandwidth data to conserve power.

In another example, the output of the PLL 310 may be used to provide a clock signal to a processor (e.g., CPU) that supports different processing speeds (clock speeds). In this example, the coarse calibration engine 460 may be configured to tune the capacitance of the second capacitor bank 455 to different values corresponding to the different processing speeds. The controller 470 may select a processing speed for the processor, and instruct the coarse calibration engine 460 to tune the capacitance of the second capacitor bank 455 according to the selected processing speed. In response, the coarse calibration engine 460 may tune the capacitance of the second capacitor bank 455 so that the initial frequency of the VCO 340 is close to a clock frequency corresponding to the selected processing speed. This reduces the tuning range required by the first capacitor bank 355 for frequency tracking. The controller 470 may also adjust the divisor of the feedback frequency divider 378 according to the clock frequency corresponding to the selected processing speed. In this example, the controller 470 may select the processing speed based temperature, application(s) running on the processor, etc. For instance, the controller 470 may reduce the processing speed (and hence clock frequency) to cool down the processor when the temperature of the processor (e.g., as measured by an on-chip temperature sensor) is too high.

It is to be appreciated that the LC tank 350 may also include fixed metal capacitors (not shown). For example, the fixed metal capacitors may be used to provide a fixed (non-tunable) component to the capacitance of the LC tank 350. This may be done, for example, to reduce the tunable range required by the second capacitor bank 455 to achieve a desired output frequency.

Figure 5:
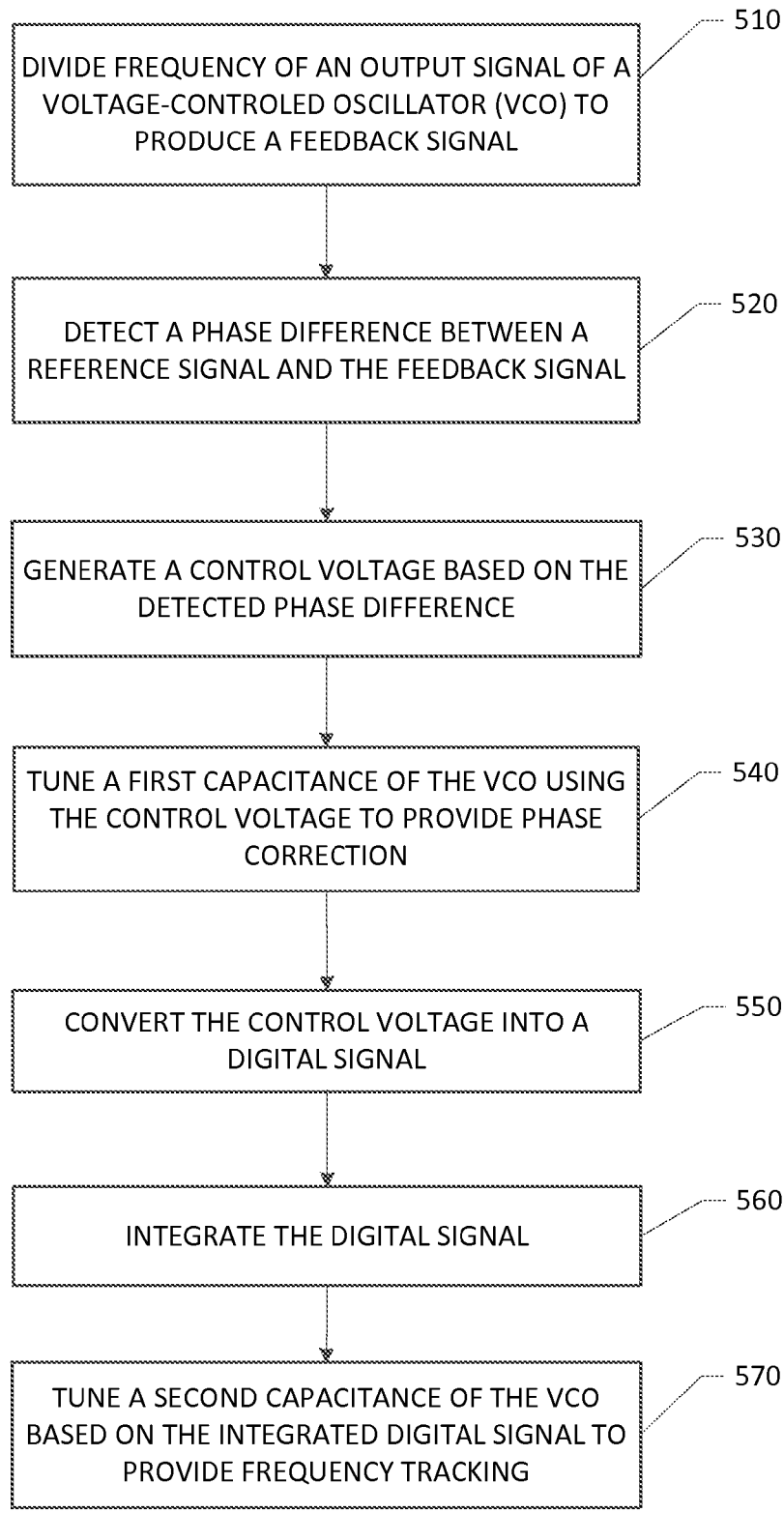
FIG. 5 is a flowchart showing a method for operating a PLL according to an embodiment of the present disclosure.

FIG. 5 is a flowchart illustrating a method 500 for operating a phase locked loop (PLL) according to an embodiment of the present disclosure. The PLL may comprise the PLL 310 in FIG. 3.

In step 510, a frequency of an output signal of a voltage-controlled oscillator (VCO) is divided to produce a feedback signal. For example, the frequency of the output signal of the VCO (e.g., VCO 340) may be divided using a fractional N divider (e.g., frequency divider 378) or other type of frequency divider.

In step 520, a phase difference between a reference signal and the feedback signal is detected. The reference signal may come from a crystal oscillator or another source. The phase difference may be detected using a phase detector (e.g., phase detector 315).

In step 530, a control voltage is generated based on the detected phase difference. For example, the control voltage (e.g., VCRTL) may be generated using an analog loop filter (e.g., loop filter 330).

In step 540, a first capacitance of the VCO is tuned using the control voltage to provide phase correction. For example, the first capacitance may correspond to a capacitance of at least one varactor (e.g., varactors 352) in the VCO, where the control voltage is coupled to the at least one varactor to tune the capacitance of the at least one varactor.

In step 550, the control voltage is converted into a digital signal. For example, the control voltage may be converted into the digital signal using an ADC (e.g., ADC 364). The ADC may comprise a sigma-delta ADC or another type of ADC.

In step 560, the digital signal is integrated. For example, the digital signal may be integrated using a digital integrator (e.g., integrator 372).

In step 570, a second capacitance of the VCO is tuned based on the integrated digital signal to provide frequency tracking. For example, the second capacitance may correspond to a capacitance of a capacitor bank (e.g., capacitor bank 355) comprising switchable capacitors, in which the capacitance of the capacitor bank is tuned by controlling the number of the switchable capacitors that are switched on.

Those skilled in the art will further appreciate that the various illustrative blocks, and steps described in connection with the disclosure herein may be implemented as electronic hardware, computer software, or combinations of both. To clearly illustrate this interchangeability of hardware and software, various illustrative components, blocks, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative blocks described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection may be properly termed a computer-readable medium to the extent involving non-transient storage of transmitted signals. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium, to the extent the signal is retained in the transmission chain on a storage medium or device memory for any non-transient length of time. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A phase locked loop (PLL), comprising:
    a voltage-controlled oscillator (VCO);
    a frequency divider configured to frequency divide an output signal of the VCO to produce a feedback signal;
    a phase detection circuit configured to detect a phase difference between a reference signal and the feedback signal, and to generate an output signal based on the detected phase difference;
    a proportional circuit configured to generate a control voltage based on the output signal of the phase detection circuit, wherein the control voltage tunes a first capacitance of the VCO to provide phase correction; and
    an integration circuit configured to convert the control voltage into a digital signal, to integrate the digital signal, and to tune a second capacitance of the VCO based on the integrated digital signal to provide frequency tracking.

2. The PLL of claim 1, wherein the proportional circuit comprises a resistor configured to generate a component of the control voltage that is approximately proportional to the detected phase difference.

3. The PLL of claim 2, wherein the VCO comprises at least one varactor, the first capacitance of the VCO corresponds to a capacitance of the at least one varactor, and the control voltage is coupled to the at least one varactor.

4. The PLL of claim 3, further comprising a voltage generation circuit configured to generate an operating-point voltage, wherein the resistor is coupled between the operating-point voltage and the at least one varactor, the operating-point voltage centering the control voltage within a linear region of the at least one varactor.

5. The PLL of claim 2, wherein the proportional circuit further comprises a capacitor configured to reduce ripple noise on the control voltage.

6. The PLL of claim 1, wherein the VCO comprises a capacitor bank comprising a plurality of switchable capacitors, the second capacitance of the VCO corresponds to a capacitance of the capacitor bank, and the integration circuit is configured to tune the capacitance of the capacitor bank based on the integrated digital signal.

7. The PLL of claim 1, wherein the integration circuit comprises:
    a sigma-delta analog-to-digital converter (ADC) configured to convert the control voltage into the digital signal; and
    a digital integrator configured to integrate the digital signal.

8. The PLL of claim 7, further comprising a second frequency divider configured to frequency divide the output signal of the VCO to produce a sampling clock signal, wherein the sigma-delta ADC samples the control voltage at a sampling rate corresponding to a frequency of the sampling clock signal.

9. The PLL of claim 8, wherein the second frequency divider frequency divides the output signal of the VCO by a smaller amount than the first frequency divider.

10. The PLL of claim 7, wherein the VCO comprises a capacitor bank comprising a plurality of switchable capacitors, the second capacitance of the VCO corresponds to a capacitance of the capacitor bank, and the integration circuit is configured to tune the capacitance of the capacitor bank based on the integrated digital signal.

11. The PLL of claim 10, wherein the integration circuit further comprises a sigma-delta modulator configured to modulate the integrated digital signal into a digital tuning word, and wherein the tuning word comprises a plurality of parallel bits, each of the parallel bits controlling a respective one of the switchable capacitors in the capacitor bank.

12. The PLL of claim 1, further comprising a coarse calibration engine configured to tune a third capacitance of the VCO.

13. The PLL of claim 12, wherein the coarse calibration engine is configured to tune the third capacitance of the VCO before the PLL performs phase locking to set an initial output frequency of the VCO.

14. The PLL of claim 12, wherein the VCO comprises a capacitor bank comprising a plurality of switchable capacitors, the third capacitance of the VCO corresponds to a capacitance of the capacitor bank, and the coarse calibration engine is configured to tune the capacitance of the capacitor bank.

15. A method of operating a phase locked loop (PLL), comprising:
    dividing a frequency of an output signal of a voltage-controlled oscillator (VCO) to produce a feedback signal;
    detecting a phase difference between a reference signal and the feedback signal;
    generating a control voltage based on the detected phase difference;
    tuning a first capacitance of the VCO using the control voltage to provide phase correction;
    converting the control voltage into a digital signal;
    integrating the digital signal; and
    tuning a second capacitance of the VCO based on the integrated digital signal to provide frequency tracking.

16. The method of claim 15, wherein the VCO comprises at least one varactor, and tuning the first capacitance of the VCO comprises tuning a capacitance of the at least one varactor.

17. The method of claim 15, further comprising:
    generating an operating-point voltage; and
    centering the control voltage at approximately the operating-point voltage.

18. The method of claim 15, wherein the VCO comprises a capacitor bank comprising a plurality of switchable capacitors, and tuning the second capacitance of the VCO comprises tuning the capacitance of the capacitor bank.

19. The method of claim 15, further comprising dividing the output signal of the VCO to produce a sampling clock signal, wherein converting the control voltage into the digital signal comprises sampling the control voltage at a sampling rate corresponding to a frequency of the sampling clock signal.

20. The method of claim 19, wherein the frequency of the sampling clock signal is higher than a frequency of the feedback signal.

21. The method of claim 15, further comprising modulating the integrated digital signal with a sigma-delta modulator, and tuning the second capacitance of the VCO comprises tuning the second capacitance of the VCO using the modulated signal.

22. An apparatus, comprising:
 a frequency divider configured to divide a frequency of an output signal of a voltage-controlled oscillator (VCO) to produce a feedback signal;
 means for detecting a phase difference between a reference signal and the feedback signal;
 means for generating a control voltage based on the detected phase difference;
 means for tuning a first capacitance of the VCO using the control voltage to provide phase correction;
 means for converting the control voltage into a digital signal;
 means for integrating the digital signal; and
 means for tuning a second capacitance of the VCO based on the integrated digital signal to provide frequency tracking.

23. The apparatus of claim 22, wherein the VCO comprises at least one varactor, and the means for tuning the first capacitance of the VCO comprises means for tuning a capacitance of the at least one varactor.

24. The apparatus of claim 22, further comprising:
 means for generating an operating-point voltage; and
 means for centering the control voltage at approximately the operating-point voltage.

25. The apparatus of claim 22, wherein the VCO comprises a capacitor bank comprising a plurality of switchable capacitors, and the means for tuning the second capacitance of the VCO comprises means for tuning the capacitance of the capacitor bank.

26. The apparatus of claim 22, further comprising means for dividing the output signal of the VCO to produce a sampling clock signal, wherein the means for converting the control voltage into the digital signal comprises means for sampling the control voltage at a sampling rate corresponding to a frequency of the sampling clock signal.

27. The apparatus of claim 26, wherein the frequency of the sampling clock signal is higher than a frequency of the feedback signal.

28. The apparatus of claim 22, further comprising means for modulating the integrated digital signal using sigma-delta modulation, and the means for tuning the second capacitance of the VCO comprises means for tuning the second capacitance of the VCO using the modulated signal.

* * * * *